(12) United States Patent
Schat et al.

(10) Patent No.: US 11,215,694 B2
(45) Date of Patent: Jan. 4, 2022

(54) BUILT-IN SELF-TEST FOR A RADAR UNIT RECEIVER AND METHOD THEREFOR

(71) Applicant: NXP B.V., Eindhoven (NL)

(72) Inventors: Jan-Peter Schat, Hamburg (DE); Abdellatif Zanati, Hamburg (DE)

(73) Assignee: NXP B.V., Eindhoven (NL)

( * ) Notice: Subject to any disclaimer, the term of this patent is extended or adjusted under 35 U.S.C. 154(b) by 327 days.

(21) Appl. No.: 16/265,141

(22) Filed: Feb. 1, 2019

(65) Prior Publication Data
US 2019/0242973 A1 Aug. 8, 2019

(30) Foreign Application Priority Data

Feb. 8, 2018 (EP) .................................... 18155707

(51) Int. Cl.
*G01S 7/40* (2006.01)
*G01S 7/35* (2006.01)
(Continued)

(52) U.S. Cl.
CPC ................ *G01S 7/40* (2013.01); *G01S 7/352* (2013.01); *G01S 7/354* (2013.01); *G01S 7/4008* (2013.01);
(Continued)

(58) Field of Classification Search
CPC ... G01S 7/032; G01S 7/32; G01S 7/35; G01S 7/352; G01S 7/40; G01S 7/4004;
(Continued)

(56) References Cited

U.S. PATENT DOCUMENTS 5,376,938 A * 12/1994 Martinez ............... G01S 7/4008
342/128
7,129,734 B2 10/2006 Geiger et al.
(Continued)

OTHER PUBLICATIONS

Jalon, M.A., "ADC Non-linearity Low-cost Test Through a Simplified Double-histogram Method", IEEE 2009.
(Continued)

*Primary Examiner* — Erin F Heard
*Assistant Examiner* — Michael W Justice

(57) ABSTRACT

A radar unit (100, 300) is described that comprises: a frequency generation circuit (103, 106, 303, 306) configured to generate a millimetre wave, mmW, frequency modulated continuous wave, FMCW, transmit signal comprising a plurality of chirps; a transmitter circuit (108, 102, 308, 302) configured to transmit the generated mmW FMCW transmit signal: a receiver circuit (104, 110, 304, 310) configured to receive an echo of the mmW FMCW transmit signal; and a built-in self-test, BIST, circuit (140, 340) coupled to the receiver circuit (104, 110, 304, 310) and configured to process the echo of the mmW FMCW transmit signal. The receiver circuit (104, 110, 304, 310) is configured to operate with at least two different paths for at least two successive chirps of the mmW FMCW transmit signal and create therefrom at least two respective received chirp signals; and the BIST circuit (140, 340) is configured to process and compare the at least two respective received chirp signals and determine therefrom an operational state of at least one circuit or component within the receiver circuit (104, 110, 304, 310).

17 Claims, 3 Drawing Sheets

(51) Int. Cl.

| | |
|---|---|
| *G01S 13/34* | (2006.01) |
| *G01S 13/931* | (2020.01) |
| *G01S 7/03* | (2006.01) |
| *G01R 31/28* | (2006.01) |
| *G06F 11/27* | (2006.01) |
| *H04B 17/14* | (2015.01) |
| *G01R 31/3187* | (2006.01) |
| *H04B 17/19* | (2015.01) |

(52) U.S. Cl.
CPC .......... *G01S 7/4021* (2013.01); *G01S 13/343* (2013.01); *G01S 13/931* (2013.01); *G01R 31/2822* (2013.01); *G01R 31/3187* (2013.01); *G01S 7/032* (2013.01); *G06F 11/27* (2013.01); *H04B 17/14* (2015.01); *H04B 17/19* (2015.01)

(58) Field of Classification Search
CPC ........ G01S 7/40017; G01S 7/23; G01S 7/023; G01S 7/4021; G01S 13/34; G01S 13/931; G01S 13/282; G01S 13/343; G01S 2013/93271; G01S 2013/93272; H03M 1/10; H03M 1/1009; G01R 31/2822; G01R 31/3187; G01R 31/31716; G06F 11/27; H04B 17/14; H04B 17/19
USPC ................ 342/173, 174; 324/750.3; 714/233
See application file for complete search history.

(56) References Cited

U.S. PATENT DOCUMENTS

| | | | |
|---|---|---|---|
| 7,587,647 B2 | 9/2009 | Olleta et al. | |
| 9,008,161 B1* | 4/2015 | Chang | H04L 27/38 |
| | | | 375/221 |
| 9,036,753 B1* | 5/2015 | Chang | H04L 25/03261 |
| | | | 375/350 |
| 9,385,822 B2* | 7/2016 | Cheng | H04L 27/3863 |
| 9,429,625 B1 | 8/2016 | Ding et al. | |
| 9,762,336 B2* | 9/2017 | Chen | H04B 17/17 |
| 9,806,877 B2* | 10/2017 | Chen | H04L 7/0033 |
| 2005/0001761 A1* | 1/2005 | Kliewer | G01S 13/343 |
| | | | 342/174 |
| 2015/0084811 A1* | 3/2015 | Mazzaro | G01S 13/87 |
| | | | 342/176 |
| 2015/0155955 A1* | 6/2015 | Chang | H04L 27/38 |
| | | | 375/226 |
| 2016/0077134 A1* | 3/2016 | Rezk | G01S 7/021 |
| | | | 324/76.39 |
| 2018/0113196 A1* | 4/2018 | Subburaj | G01S 7/4021 |

OTHER PUBLICATIONS

Jin, L., "Accurate Testing of Analog-to-Digital Converters Using Low Linearity Signals With Stimulus Error Identification and Removal", IEEE Transactions on Instrumentation and Measurement, vol. 54, No. 3, Jun. 2005.

Jin, L., "High-Performance ADC Linearity Test Using Low-Precision Signals in Non-Stationary Environments", International Test Conference, IEEE 2005.

Korhonen, E., "A Robust Algorithm to Identify the Test Stimulus in Histogram-Based A/D Converter Testing", IEEE Transactions on Instrumentation and Measurement, vol. 56, No. 6, Dec. 2007.

Korhonen, E., "An Improved Algorithm to Identify the Test Stimulus in Histogram-Based A/D Converter Testing", 3th European Test Symposium, IEEE 2008.

Magstadt, B., "Accurate Spectral Testing With Impure Source and Noncoherent Sampling", IEEE Transactions on Instrumentation and Measurement, vol. 65, No. 11, Nov. 2016.

* cited by examiner

BUILT-IN SELF-TEST FOR A RADAR UNIT RECEIVER AND METHOD THEREFOR

CROSS-REFERENCE TO RELATED APPLICATIONS

This application claims the priority under 35 U.S.C. § 119 of European Patent application no. 18155707.5, filed on Feb. 8, 2018, the contents of which are incorporated by reference herein.

FIELD OF HE INVENTION

The field of the invention relates to a built-in self-test (BIST) system for testing an analog or analog/mixed-signal circuit or component, such as an analog-to-digital converter (ADC) in a receiver of a radar unit. The invention is applicable to, but not limited to, a non-intrusive, interruption-free BIST for parameter estimation of a mmW vehicle radar unit employing chirps in a frequency modulated continuous wave (FMCW) mode of operation.

BACKGROUND OF THE INVENTION

A majority of the current millimetre wave (mmW) radar units are constructed using mmW integrated circuits (ICs) that include multi-channel transceivers (TRX) that are operable across a number of frequency channels. The mmW ICs also include high frequency devices, such as, power amplifiers, mixers, low noise amplifiers (LNAs), as well as analog and analog mixed-signal circuits. In the automotive radar field, the supported frequencies are, in Europe, predominantly in the 76-81 GHz frequency bands.

Automotive safety standards, such as ISO 26262, mandate the use of mitigating measures in case of safety-relevant defects; these mitigating measures need to be completed within a defined time interval that is small enough to prevent a system failure that could be dangerous to a person inside or outside the vehicle. Detecting safety-relevant defects in the radio frequency (RF) front-end of a car radar system can be performed using plausibility checks performed in the radar unit that evaluate, say, the receiver's front-end's output signal or other internal circuitry's output signal and calculates a target map from this signal. If this target map shows, e.g., suddenly appearing or disappearing targets, this would then lead to the target map being classified as either not plausible and the RF front-end or other internal circuitry as possibly defect so that the radar unit could initiate safety measures, e.g. system reset, repetition of the measurement cycle, or notifying the driver that the radar system needs to be considered unsafe.

While such plausibility checks are very common in safety-critical systems, they have two severe drawbacks. A first drawback is directly related to safety, as every plausibility check bears the risk of false-positive or false-negative decisions. A second drawback is that plausibility checks need to be implemented, documented and verified for a large number of possible faults (e.g. at circuit nodes) and for several fault models including transient faults. To prove an automotive safety integrity level (ASIL) grade of a system according to ISO 26262, the diagnostic coverage of the plausibility check needs to be calculated or assessed. All of these procedures are time-consuming and error-prone. These two drawbacks make it desirable to avoid the need for plausibility checks and to implement as much built-in safety monitoring (e.g. built-in safety tests (BIST)) as reasonable in the safety-critical elements themselves. In response to such monitoring or testing, the radar unit may initiate safety measures, e.g. system reset, repetition of the measurement cycle, or notifying the driver that the radar system needs to be considered unsafe. Furthermore, it is also known that transient faults are a major source of malfunctions, and hence it is desirable to be able to test these.

Thus, presently, it is known for BIST to be used to determine a performance of the ADC. However, such a known BIST runs in parallel to the application mode of operation and is designed to cover and identify most static faults that lead to complete failures or to parametric failures. Known safety monitors are configured to run in addition to the application mode of operation, and are configured to measure, for example, supply voltage or transmit power, and thereby identify most static faults that lead to complete failure or parametric failures, and most transient faults that lead to complete failure or parametric failure. However, safety monitors are not available for ADCs because safety monitors monitor 'simple' values such as supply voltages, reference voltages, clock signals, RF amplitudes etc. Failures in ADCs are only occasionally related to such 'simple' values, more often than not they are related to more complex values such as resistor values, transistor parameters etc. that cannot be measured by safety monitors.

Other possible solutions have complexity or cost implications, such as using and comparing the outputs of multiple ADCs, which incurs additional hardware overhead, or doubling or tripling the clock frequency of the ADC (thus converting each sample of the analog input voltage two or three times, and then compare the two or three resulting digital ADC output values), which causes an increase in the ADCs conversion rate that may decrease the ADC performance, increase ADC current consumption, be above the specified or allowed conversion of the respective ADC.

In vehicle radar systems, functional safety is crucial, as a malfunction can either lead to a dangerous situation, e.g. automatic braking because the malfunctioning system reports one or more targets which actually don't exist, or to a failure to react, e.g. if existing targets are not detected. For both cases, a moderate system performance degradation is often the worst-case scenario, as a complete system failure would be immediately detected, whereas a moderate performance degradation might only lead to misinterpreting a target's size, position, direction of movement, etc., which could cause one of the above-mentioned malfunctions.

The basic theory for estimating low-frequency ADC parameters such as integral non-linearity (INL) and differential non-linearity (DNL) using a low-quality input signal for high-resolution ADCs, as part of the document titled: 'Accurate Testing of Analog-to-Digital Converters using low linearity signals with Stimulus Error Identification and Removal', published on 3 Jun. 2005, in pages 1188-1199 in the IEEE Transactions on Instrumentation and Measurement, Vol. 54, No. 3. The basic theory for estimating high-frequency ADC parameters, such as signal-to-noise ratio (SNR) and/or total harmonic distortion (THD) using a low-quality input signal for high-resolution ADCs, has been published in the document titled: 'Accurate Spectral Testing with Impure Source and non-coherent sampling' on 11 Nov. 2016, in Vol. 65, Page 11 of the IEEE Transactions on Instrumentation and Measurement, Thus known techniques are typically based on one variety of either of these two documents and have a number of features in common, for example:

(i) They test analog or analog/mixed-signal blocks, mainly ADCs;

(ii) The test can be either production test and/or built-in self-test;

(iii) They use a dedicated signal generator to generate an 'impure' input signal, either a ramp for INL/DNL test, or a sine wave for SNR/THD test, or an arbitrary waveform;

(iv) The input waveform may be of lower quality than the circuit under test, e.g. a 7-bit-accuracy waveform to test a 16-bit ADC;

(v) The input waveform is applied at least twice to a specific block/circuit under test, once without modification and once after being modified. In all known approaches, the modification is a DC offset added; other than for 'Accurate Spectral Testing with Impure Source and Non-coherent Sampling', where the modification consists of high-pass or low-pass filtering the input signal;

(vi) The captured output signals of the block under test of the unmodified and the modified input signals are post-processed. As the unmodified and the modified input signals both contain the transfer function of the block under test, there is a huge redundancy that is used for estimating the deviation of the input waveform from its ideal shape (in case of ramp or sine wave). This information of the deviation is used to calculate a corrected output signal of the block under test, i.e. the output signal as it would be produced with an ideal input waveform. This corrected output signal is then calculated for one or more of: INL, DNL, SNR, THD; and (vii) The measurement is not done in the application mode, but either in production test, or in the field alternating to the application mode, or in the field during start-up or power-down or after detection of a fault or a suspected fault.

Thus, there exists a need for an improved mechanism to determine a performance of, say, a radar unit, for example using a BIST system.

SUMMARY OF THE INVENTION

The present invention provides a built-in self-test, BIST, a radar unit and method for determining a performance of an analog or analog/mixed-signal circuit or component therein, as described in the accompanying claims. Specific embodiments of the invention are set forth in the dependent claims. These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

Figure 1:
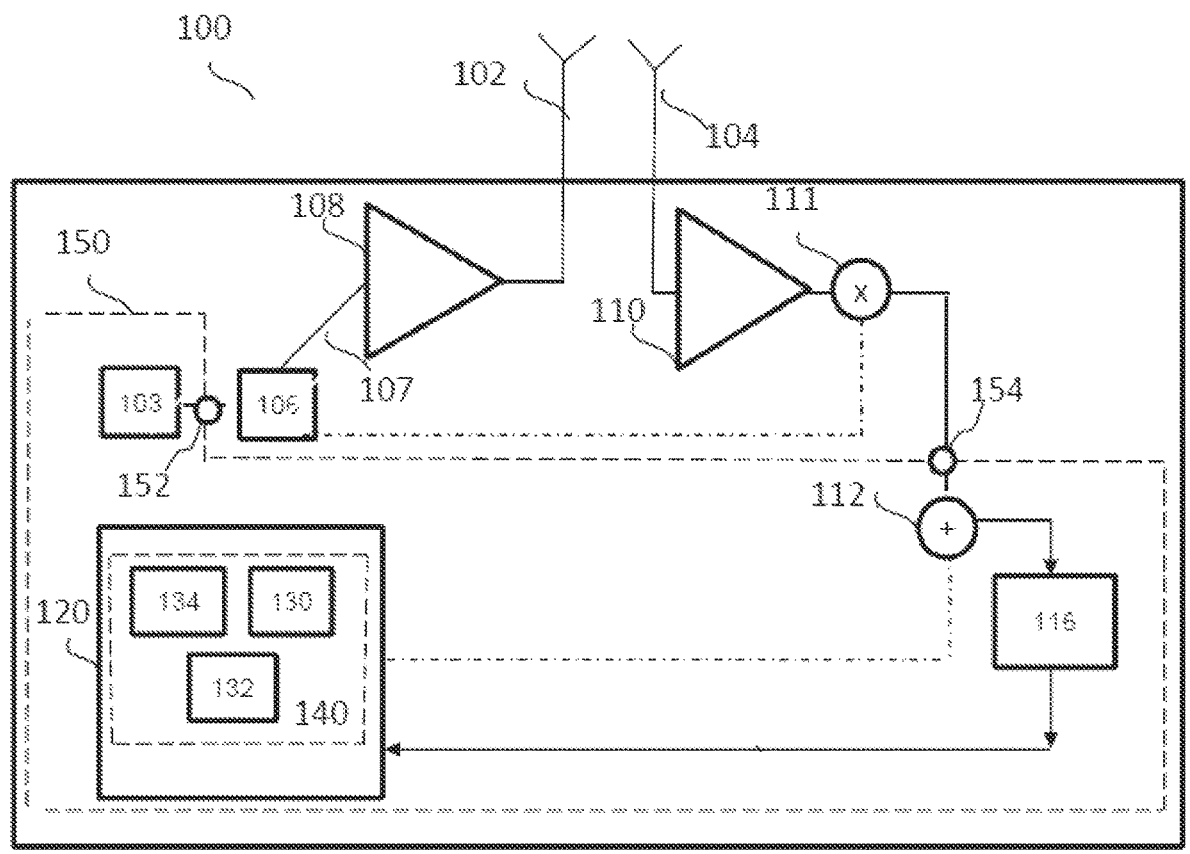
FIG. 1 illustrates an example of a communication unit, in a form of a radar unit, having a built-in self-testing (BIST) system with a DC offset injection applied to the receiver path, according to example embodiments of the invention.

Because the illustrated embodiments of the present invention may, for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

Examples of the invention describe a communication unit, in a form of a radar unit that includes a BIST running concurrent to the application, covering nearly all static failures that lead to complete failure or parametric failure, and nearly all transient faults that lead to complete failure or parametric failure, for ADCs, as well as other components and circuits within the receiver chain.

The inventors have identified and appreciated that no BIST techniques are known that run concurrent to the application, and the provision of a BIST technique that uses the application signal may provide at least two advantages, in that they will also be able to detect transient faults, and that they don't interrupt the application mode of operation for detecting parametric failures of, circuits or components in a radar unit receiver chain.

In radar systems, such as vehicle-based Frequency Modulation Continuous Wave (FMCW), a target map is obtained by transmitting several chirps (i.e. short signal blocks of steadily increasing or decreasing frequency) and processing the received, digitized echo signals. A target map is a list of target objects, where each target is listed with its target strength, distance and velocity relative to the radar unit. As the distance range of these radar units and systems is small—usually of the order of a few hundred meters—the chirps can be transmitted with very high repetition rate, e.g. 100 μs. Due to this fast repetition rate, the targets reflecting the signal usually change their position (and thus their echo signal) insignificantly from one chirp to the next. In this manner, the received signal itself changes only very little from chirp to chirp.

The inventors have acknowledged, have appreciated and propose to utilise this fact, in vehicle radar units, as the received radar echo signals of consecutive bursts (referred to as chirps) are highly correlated, so much so that they can be treated as if they were equal. In this regard, the inventors propose to use real radar signals, rather than test signals, as a signal source for a BIST of at least one receiver circuit in a receiver chain. In some examples, immediately successive chirps may be received and processed differently, for example by re-configuring the receiver path on a per-chirp basis. In some examples, it is envisaged that the successive chirps that are received and processed differently may be spaced over a few chirps, dependent upon the chirp rate for example, so long as the separation in time is such that coherency between the received chirps is maintained. In this manner, and advantageously, this BIST can be performed in a non-intrusive manner without interruption of the normal radar operation. Furthermore, examples of the invention benefit from there being no need to use or implement a dedicated signal generator to perform the BIST. This is especially relevant and useful for functional safety situations, as this method also allows for detection of sudden event upsets.

In some examples, the use of signals derived in the application mode, hereinafter referred to as 'application signal', as a signal source for a BIST operation, enables the signal that is normally being passed through a complete receiver signal processing chain to be used to determine the performance of the complete receiver. This is in contrast to a known use of a dedicated signal generator whereby only sections of the receiver chain are tested. Thus, in some examples, the tested receiver chain may include: the radar local oscillator generation circuitry, RF down-mixer(s), RF amplifiers and filters, the ADC, etc.

In some examples, embodiments of the invention use these chirp echo signals to calculate not only a target map, but also concurrently to estimate the linearity parameters of the analog or analog-mixed signal circuits and/or components. Examples of the invention may utilise any known mechanism to correlate between the echo waveforms of two successive chirps, for example using the algorithm described in the document titled: ADC Non-linearity low-cost test method through a simplified double-histogram method, M. A. Jalon, E. Peralias, 2009 IEEE 15th International Mixed-Signals, Sensors, and Systems Test Workshop, p. 1-6, using a real radar signal rather than a dedicated test waveform (e.g. ramp or sinewave).

In some example embodiments, evaluation of the chirp signal and controlling a DC injection and/or AC filtering may be performed by an on-chip microcontroller. In this case, when employing the examples herein described, the ASIL rating (i.e. the degree of Functional Safety of a safety-critical component used for automotive applications in ISO 26262) of the whole radar unit (or radar IC) may be higher and/or easier to validate due to the internal, online self-check provided by the BIST.

In some example embodiments, any changes from one chirp echo to the next chirp echo are understood to be similar to the changes caused by drift of the superimposed DC signal and accordingly may be compensated for. For example, in some instances, drift compensation techniques may also be used to compensate for any small change of the echo waveform.

Examples of the invention are thus targeted to calculation of parameters (such as INL, DNL, THD, SNR, the LO's linearity, the Rx mixer's linearity, etc.) of an analog or analog/mixed-signal circuit or component-under-test using different DC offsets and/or filtering techniques using real radar echo signals obtained during the application (normal) radar mode of operation, instead of using a ramp signal that was specifically created for testing purposes, uses dedicated test hardware and is applied on an intermittent basis.

FIG. 1 illustrates a first example of a communication unit, in a form of a radar unit 100, with built-in self-testing (BIST) system 140, according to example embodiments of the invention. In a transmitter sense, a transmit radar signal is provided to a waveform generator 103, which may include a frequency chirp generator circuit. The waveform generator provides a transmit signal that is to be modulated by a local oscillator (LO) circuit 106. The modulated signal is then optionally passed to a frequency multiplier (not shown), if the LO generated signal is not at the operating frequency of the radar unit. The high-frequency output 107 of the LO 106 (or the frequency multiplier) is passed to at least one transmitter radio frequency power amplifier 108 arranged to amplify and route the amplified high frequency transmit signal to a transmit antenna 102.

The radar unit 100 also includes at least one receiver that includes a low noise amplifier (LNA) 110 arranged to amplify a received echo signal, received at receive antenna 104. The output of the LNA 110 is input to a down-mixer 111, coupled to the LO 106 and arranged to down-convert the received echo signal. The radar unit 100 is configured to operate in a frequency modulated continuous wave (FMCW) mode of operation, sometimes referred to as a chirp mode of operation. In this example, the BIST system 140 of the radar unit 100 includes a controller 130, at least one memory 132 and at least one processor 134. Although in the illustrated example a single transmit and a single receive path are shown, in other examples more transceiver and/or receiver paths may be supported.

In this example, the BIST system 140 of the radar unit 100 has been adapted such that the controller 130 is configured to generate a DC offset injection signal that is intermittently applied to the receiver path, for example via summing junction 112 and in an analog domain before the analog-to-digital converter (ADC) 116, according to example embodiments of the invention. In a radar unit 100 configured to use frequency modulated continuous wave (FMCW) modulation, the DC offset value may be injected during reception of some chirps in the analog domain of the ADC 116 and then subtracted again at the digital side, but only in the signal path used to calculate the target map (FIG. 4, 432), not in the signal path used for the BIST (FIG. 4, 442, 444, 446), (for example by software in an algorithm in processor 134 to evaluate these signals). In FMCW, the transmit signal changes only according to the slope of the chirp ($\Delta f/\Delta t$), whilst the receive signal changes according to the slope of the chirp ($\Delta f/\Delta t$) and the distance between the radar unit and the target. Hence, nearby targets exhibit a low frequency shift and thus low frequency in the IF, after the down-mixer, and require filtering out by a high-pass response. The digital output from the ADC 116 is input to a digital baseband processing circuit 120 that includes, in this example, the BIST system 140. The digital output from the ADC 116 includes any band-pass filter response, which is combined and input to a digital functional evaluation circuit, for example processor 134 of the BIST system 140 for processing the received radar signal.

In this example, DC offset injection may be applied in different chirps in an alternating (010101) manner, for example using the first bits of the Thue-Morse Sequence (e.g. 01101001 for cancelling linear and quadratic drift). The Thue-Morse Sequence is a known infinite binary sequence, and thus, in examples of the invention, only the first 4 or 8 or 16 bits of this sequence may be applied. In some examples, using the first 4 bits, 0110, may be used to cancel out linear drift, whereas using the first 8 bits, 01101001, may be used to cancel out linear and square drift, whereas using the first 16 bits, 0110100110010110, may be used to cancel any linearity errors, square, cubic drift, etc. In some examples, the DC offset may be relatively small, for example less than 10% of the received signal level. In some examples, the injected DC offset may be of the order of 0.1%-1% of the full-scale received signal.

In some examples, as illustrated, an integrated circuit 150 may incorporate a number of the components associated with the concepts herein described. In the example shown, the integrated circuit 150 includes all of the baseband circuitry and components, including the analog and analog/mixed signal components in the receiver chain, such as filters, limiters, ADCs, as well as the BIST circuit 140. Thus, in this example, the integrated circuit 150 includes a frequency generation circuit that includes the waveform generator 103, which may include a frequency chirp generator circuit, configured to generate a FMCW transmit signal comprising a plurality of chirps. The integrated circuit 150 further includes a receiver circuit (including ADC 116) configured to receive an echo of the FMCW transmit signal; and a built-in self-test (BIST) circuit 140 coupled to the ADC 116 of the receiver circuit and configured to process the received echo of the FMCW transmit signal. In examples of the invention, the receiver circuit is configured to operate with at least two different paths for at least two successive chirps of the FMCW transmit signal and create therefrom at least two respective received chirp signals. The BIST circuit 140 is configured to process and compare the at least two respective received chirp signals and determine therefrom an operational state of at least one circuit or component within the receiver circuit. In this example, the integrated circuit includes a number of input/output ports 152, 154 that interface the integrated circuit with other circuits and components within the radar unit. In other examples, the integrated circuit may include other components, such as the RF, low power analog components and circuits in the receiver chain, i.e. all or a majority of the radar unit functionality may reside in one IC.

Figure 2:
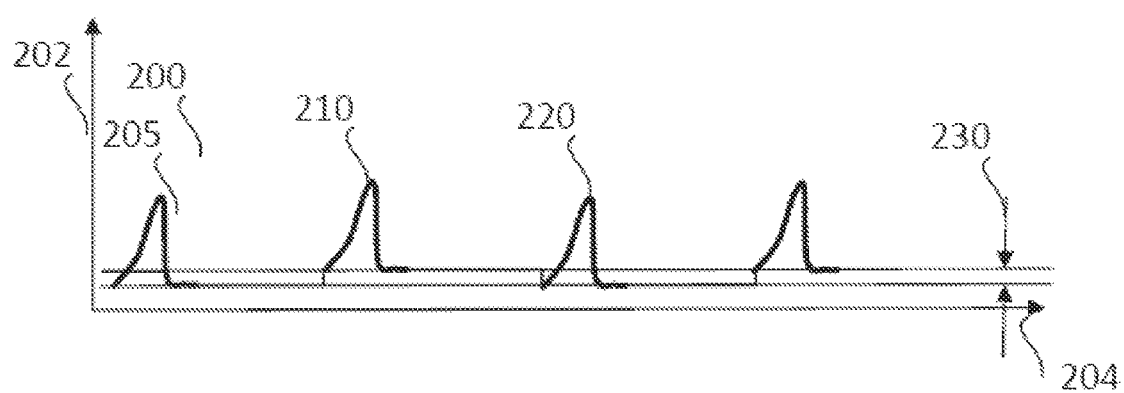
FIG. 2 illustrates an example timing diagram of an ADC input signal after DC offset injection to the chirp echo signals, according to example embodiments of the invention.

Referring now to FIG. 2, an example timing diagram 200 of an ADC input signal after DC offset injection to the chirp echo signals is illustrated, according to example embodiments of the invention. The example timing diagram 200 of an ADC input signal illustrates voltage (or current) 202 versus time 204 for the received chirp signal.

In some examples, the application algorithm (for example a separate software algorithm employed by the at least one processor 134 of FIG. 1) may be configured to correct the received signal before using it in order to calculate the target map, to avoid the injected DC offset value being visible for the algorithm that calculates the target map in, say, an on-line ADC parameter estimation. Alternatively, in some examples, the injected DC may be numerically cancelled out in an ADC output signal. Thus, with reference to FIG. 2 and FIG. 1, a received first echo (chirp) signal is received at receive antenna 104, amplified in LNA 110 and down-converted in down-mixer 111 resulting in a received baseband analog signal 205 in FIG. 2. A DC offset 230 is introduced via path 114 at summing junction 112 to a received second echo (chirp) signal 210. In this example, the DC offset is then removed in the analog domain in a received third echo (chirp) signal 220.

In some examples, by correcting for the DC offset injection prior to signal processing of the received signal in BIST system 140, the DC offset may be invisible to the application algorithm that calculates the target map, which may also be a separate software algorithm employed by the at least one processor 134.

In this manner, a comparison between respective, successive chirp signals (with different DC offsets) can be made and analysed in order to determine (or calculate) not only a target map, but also concurrently to estimate one or more linearity parameters of one or more of the analog-mixed signal circuitry from the antenna 104 to the ADC 116. The approach to use different DC offset levels allows for calculating the INL or DNL. For calculating the target map, however, the different DC offset levels are not needed (and would actually disturb the accuracy of the target map if not prior cancelled/removed, as herein described. Thus, and advantageously, safety-critical faults may be detected in real time, with (or without) minimal hardware changes, and without the need of plausibility checks.

Figure 3:
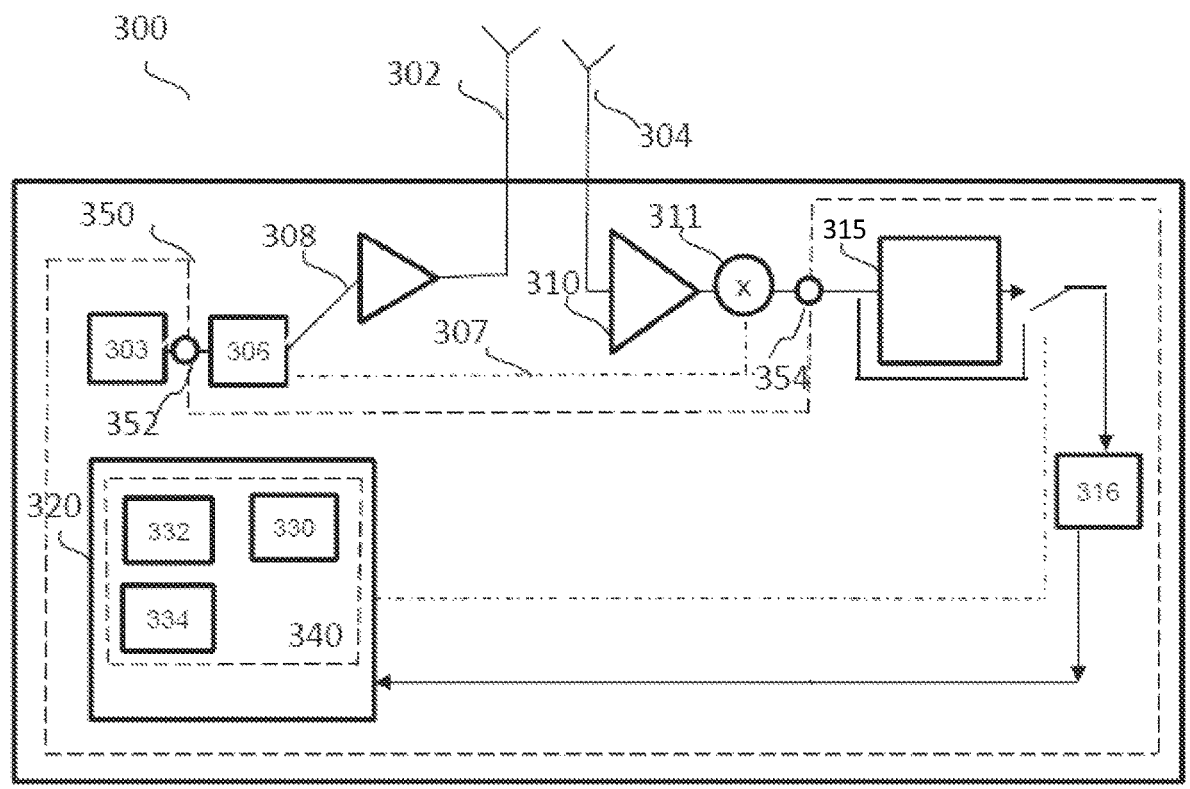
FIG. 3 illustrates an example of a communication unit, in a form of a radar unit, having a built-in self-testing (BIST) system with one or more selectable filters available in the receiver path, according to some example embodiments of the invention.

FIG. 3 illustrates a second example of a communication unit, in a form of a radar unit 300, with built-in self-testing (BIST) system 340, according to example embodiments of the invention. In a transmitter sense, a transmit radar signal is provided to a waveform generator 303, which may include a frequency chirp generator circuit. The waveform generator provides a transmit signal that is to be modulated by a local oscillator (LO) circuit 306. The modulated signal is then optionally passed to a frequency multiplier (not shown), if the LO generated signal is not at the operating frequency of the radar unit. The high-frequency output 307 of the LO 306 (or the frequency multiplier) is passed to at least one transmitter radio frequency power amplifier 308 arranged to amplify and route the amplified high frequency transmit signal to a transmit antenna 302.

The radar unit 300 also includes at least one receiver that includes a low noise amplifier (LNA) 310 arranged to amplify a received echo signal, received at receive antenna 304. The output of the LNA 310 is input to a down-mixer 311, coupled to the LO 306 and arranged to down-convert the received echo signal. The radar unit 300 is configured to operate in a frequency modulated continuous wave (FMCW) mode of operation, sometimes referred to as a chirp mode of operation. In this example, the BIST system 340 of the radar unit 300 includes a controller 330, at least one memory 332 and at least one processor 334.

In this example, the BIST system 340 of the radar unit 300 has been adapted such that the controller 330 is configured to switch filters between different, successive chirps using, say, different corner frequency settings of already existing anti-aliasing low-pass filters, or with different corner frequency settings of already existing high-pass filters, intermittently applied to received signals in the receiver path, for example via filter 315. This selectable filter switching is performed in an analog domain before the analog-to-digital converter (ADC) 316, according to example embodiments of the invention. The digital output from the ADC 316 is input to a digital baseband processing circuit 320 that includes, in this example, the BIST system 340. In a radar unit 300 configured to use frequency modulated continuous wave (FMCW) modulation, the filter switching may be performed between successive chirps by software in the algorithm that evaluates these signals, such as the at least one processor 334.

In this example, the filter switching may be applied in different chirps in an alternating (010101) manner, for example using a Thue-Morse Sequence (e.g. 01101001 for cancelling linear and quadratic drift). In this example, the Thue-Morse Sequence is a binary sequence with some very useful properties, for example the sequence may be used to cancel out the effects of linear drift.

In some examples, by correcting for the filter switching prior to signal processing of the received signal, the filter switching may be invisible to the application algorithm that calculates the target map, which may also be a separate software algorithm employed by the at least one processor 334.

In this manner, a comparison between respective, successive chirp signals (with different filtering applied) can be made and analysed to determine (or calculate) not only a target map, but also concurrently to estimate one or more linearity parameters of the analog-mixed signal circuitry from the antenna 304 to the ADC 316. The approach to use different filtering allows for calculating the SNR/THD. For calculating the target map, however, the different filtering is not needed (and would actually disturb the accuracy of the target map if not prior cancelled/removed, as herein described. Thus, and advantageously, safety-critical faults may be detected in real time, with (or without) minimal hardware changes, and without the need of plausibility checks.

Again, in some examples, as illustrated, an integrated circuit 350 may incorporate a number of the components associated with the concepts herein described. In the example shown, the integrated circuit 350 includes all of the baseband circuitry and components, including the analog and analog/mixed signal components in the receiver chain, such as filters, limiters, ADCs, as well as the BIST circuit 340. Thus, in this example, the integrated circuit 350 includes a frequency generation circuit that includes the waveform generator 303, which may include a frequency chirp generator circuit, configured to generate a FMCW transmit signal comprising a plurality of chirps. The integrated circuit 350 further includes a receiver circuit (including ADC 316) configured to receive an echo of the FMCW transmit signal; and a BIST circuit 340 coupled to the receiver circuit 316 and configured to process the received echo of the FMCW transmit signal. In examples of the invention, the receiver circuit is configured to operate with at least two different paths for at least two successive chirps of the FMCW transmit signal and create therefrom at least two respective received chirp signals. The BIST circuit 340 is configured to process and compare the at least two respective received chirp signals and determine therefrom an operational state of at least one circuit or component within the receiver circuit. In this example, the integrated circuit includes a number of input/output ports 352, 354 that interface the integrated circuit with other circuits and components within the radar unit. In other examples, the integrated circuit may include other components, such as the RF, low power analog components and circuits in the receiver chain.

Figure 4:
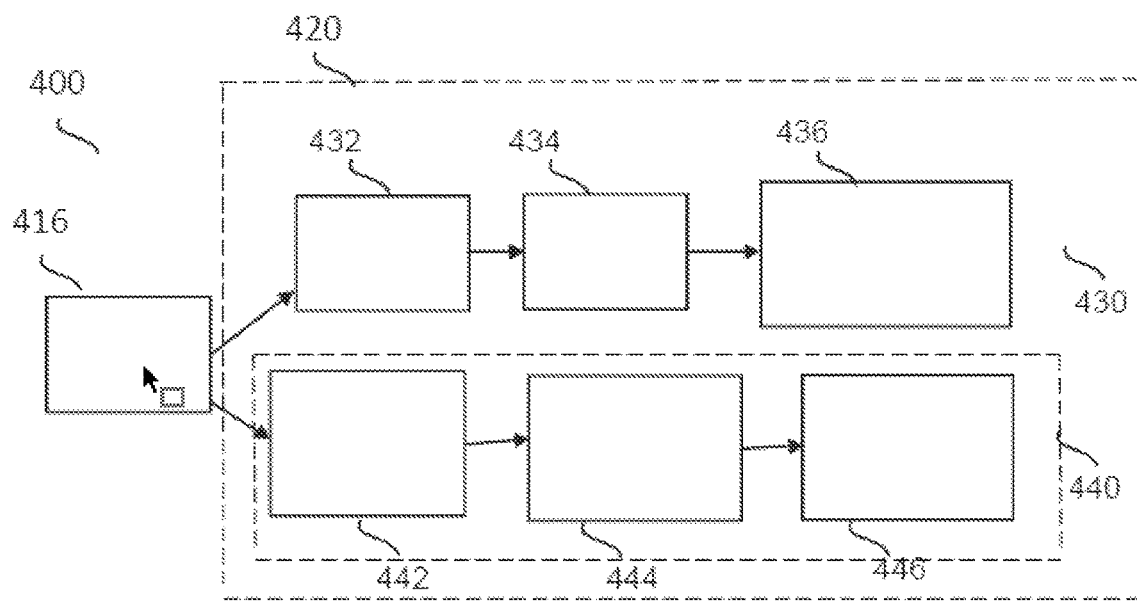
FIG. 4 illustrates an example architecture of various parameter monitoring circuits in a receiver path, according to example embodiments of the invention.

Referring now to FIG. 4, an example architecture 400 of various parameter monitoring, evaluation and signal correction circuits in a receiver path is illustrated, according to example embodiments of the invention. The example architecture 400 includes an ADC 416, such as ADC 116 from FIG. 1 or ADC 316 from FIG. 3, arranged to provide a digital representation of the received echo signal. The digital output from the ADC 416 is input to a digital baseband processing circuit 420 that includes, in this example, the BIST system 440 and corresponding BIST processing path considered in functional circuits, rather than physical devices. Thus, and notably in examples of the invention, the digital representation is provided to two evaluation paths 430, 440. A first evaluation path 430, e.g. an application signal processing path, comprises a removal, in a signal manipulation circuit 432, of the effects introduced into the received signal prior to the ADC 416, e.g. removal of the DC injection of FIG. 1 or the AC filter characteristics of FIG. 3. In some examples, the cancelling of the filter effects may be achieved by applying a digital filter in the receiver path of the digital domain with the inverse characteristic. In some examples, the cancelling of the filter effects may be achieved by performing a fast Fourier transform (FFT) on the received signal, and subsequently perform a correction in the frequency domain, and then perform an inverse FFT. The output from signal manipulation circuit 432 is input to a target map calculation circuit 434 configured to generate a target map from the digitally corrected received signal, and thereafter a target map evaluation processor 436 configured to evaluate the target map. For example, in a cruise control system, target map evaluation processor 436 detects obstacles in front of the vehicle. Alternatively, for example in a parking assist system, it helps maneuvering to the area that the vehicle is going to be parked, etc.

A second evaluation path 440, i.e. the BIST processing path, comprises one or more of an INL and/or DNL and/or SNR and/or THD, etc. calculation function 442, which may be performed in a processor, such as processor 134 in FIG. 1 or processor 334 in FIG. 3. In some examples, the INL and/or DNL and/or SNR and/or THD, etc. values from the INL and/or DNL and/or SNR and/or THD, etc. calculation function 442 may be evaluated in INL and/or DNL and/or SNR and/or THD, etc. evaluation function 444, which may be performed in the same processor.

In some embodiments, the obtained values for INL and/or DNL and/or SNR and/or THD, etc, will be used for online calibration of an ADC or other analog-mixed signal elements, such as one or more of: amplifiers, filters, analog multiplexers, analog switches, transmission lines, limiters (if the limiter is operated in its non-limiting range). In some embodiments, the obtained values for one or more of: INL and/or DNL and/or SNR and/or THD, etc. may be stored in a memory, such as memory 132 from FIG. 1 or memory 332 from FIG. 3, that holds the data contents after power-down. In some examples, the evaluation function 444 constitutes a safety monitor. In some examples, the evaluation function 444 is configured to evaluate these ADC parameters and compare them to either: (i) a fixed limit, (ii) previously measured parameters, or (iii) in a case of more than one ADC present, the respective parameters of the other ADC(s). In this manner, any values measured some time ago can then be compared to the present values, so that aging or slow activation and worsening of latent defects can be detected a long time before they manifest as safety-critical defects.

In some examples, a third safety algorithm 446 may be configured to take measurements in case the INL and/or DNL and/or SNR and/or THD, etc. evaluation function 444 outputs an indication as to whether safety measures have been compromised, such that its performance is degraded in a case of a detected fault. In response thereto, the third safety algorithm 446 may be configured to effect one or more of: a system restart, a system de-activation, or a warning to the vehicle driver that the system might be unreliable.

Figure 5:
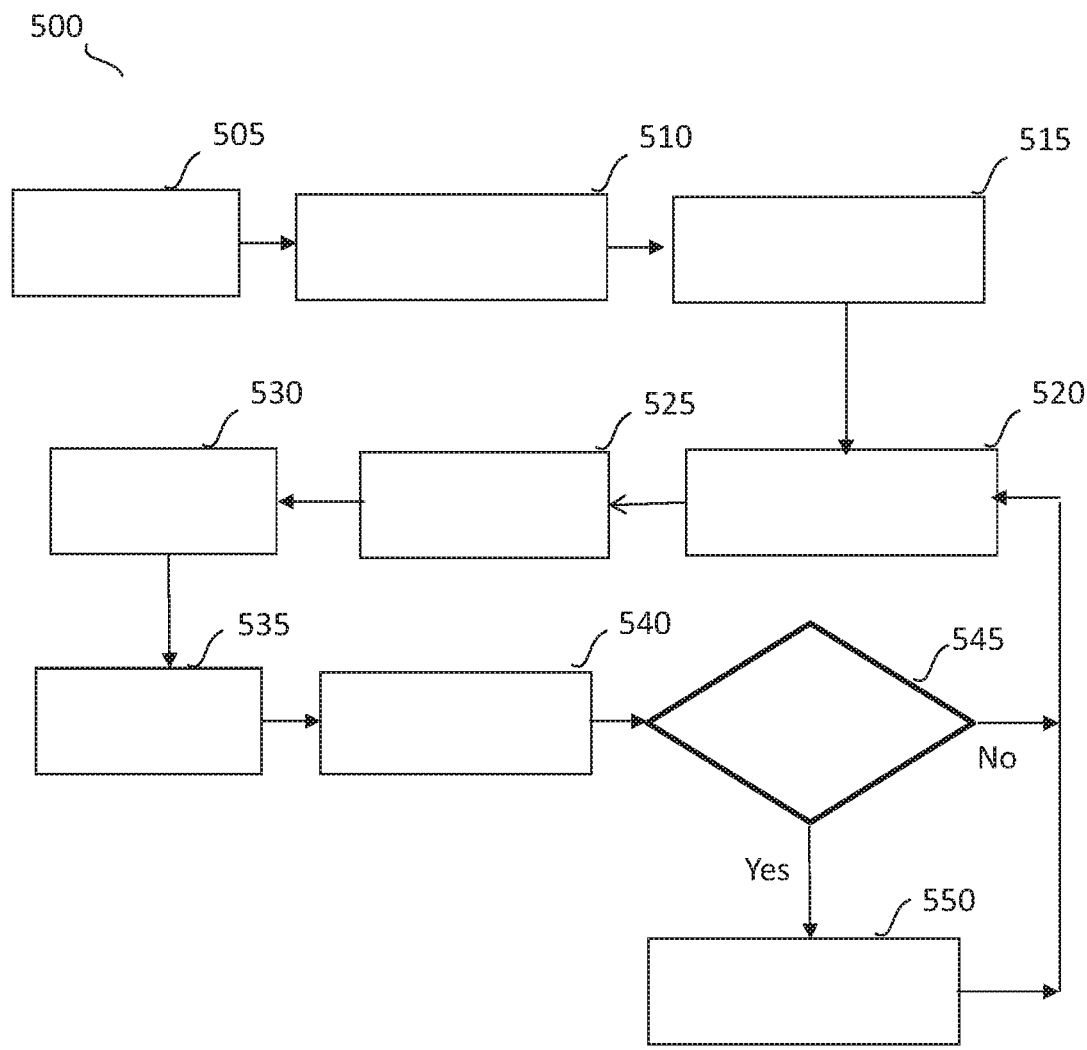
FIG. 5 illustrates an example flowchart for receiver circuit or component testing in a mmW self-test, BIST, radar unit, according to example embodiments of the invention.

Referring now to FIG. 5, an example flowchart 500 for receiver circuit or component testing in a mmW BIST-based radar unit, according to example embodiments of the invention. At 505, in an FMCW (chirp) mode of operation, the flowchart 500 commences with a set of 'N' chirps being generated. At 510, the generated set of chirps is transmitted from the radar unit (e.g. radar unit 100 of FIG. 1 or radar unit 300 of FIG. 3). At 515, an echo of the transmitted chirp is received at the radar unit and passed through the various receiver circuits and components. At 520, the received chirp is converted to a digital form, for example in ADC 116 of FIG. 1 or ADC 316 of FIG. 3, and passed to a BIST system. At 525, a second chirp is received and processed at the radar unit (e.g. radar unit 100 of FIG. 1 or radar unit 300 of FIG. 3).

At 530, and in accordance with examples of the invention, the received second chirp is subject to a different receiver circuit implementation, e.g. by inserting or removing a DC offset of the received chirp (according to the operation of FIG. 1) or adapting (e.g. inserting or removing) a filter response (according to the operation of FIG. 3). At 535, the received second chirp is converted to a digital form, for example in ADC 116 of FIG. 1 or ADC 316 of FIG. 3, and passed to the BIST system. In some examples, at 540, the intermediate frequency (IF) spectrum is captured from each of the first and second chirps. Additionally, in some examples, peaks of the baseband or IF spectra are searched and compared. At 545, a determination is made as to whether one or more circuits or components of the receiver chain, e.g. a linearity impacting element or circuit, such as the ADC, should be adapted or modified in order to meet a specific performance requirement. If it is determined that one or more circuits or components of the receiver chain is/are not to be adapted or modified in 545 the process loops back to 520 and the next chirp is processed. If one or more circuits or components of the receiver chain is/are to be adapted or modified in 545 in order to meet a specific performance requirement, based on the comparison of the received chirps during the FMCW (chirp) mode of operation, one or more parameters associated with the circuit(s) or component(s) is/are adjusted or modified at 550 or a system reset or a system shut-down is performed. The flowchart then loops to 520 and the next chirp is processed and assessed.

Thus, in this manner and in accordance with some examples of the invention, the BIST radar unit, such as radar unit 100, is able to self-determine an operational state of the radar unit and in some examples identify an error with one or more from a group of: a LNA, a linearity performance of an ADC, phase shifter, a phase rotator, a down-mixer, a LO signal, an intermediate frequency stage, a signal generator, etc.

Examples of the invention provide a built-in self-test, BIST, radar unit that includes: a frequency generation circuit configured to generate a millimetre wave, mmW, frequency modulated continuous wave, FMCW, transmit signal comprising a plurality of chirps; a transmitter circuit configured to transmit the generated mmW FMCW transmit signal: a receiver circuit configured to receive an echo of the mmW FMCW transmit signal; and a BIST circuit coupled to the receiver circuit and configured to process the echo of the mmW FMCW transmit signal. The receiver circuit is configured to operate with at least two different paths for at least two successive chirps of the mmW FMCW transmit signal and create therefrom at least two respective received chirp signals. The BIST circuit is configured to process and compare the at least two respective received chirp signals and determine therefrom an operational state of at least one circuit or component within the receiver circuit. In this manner, by using real transmitted chirps and adding a DC offset or passing the signal through a linear filter in order to treat the respective chirps on an individual basis, the effects of the receiver circuits and components can be compared between respective chirps and their operational status and performance determined.

Examples of the invention are described with reference to operating in the automotive radar frequency band of 76 GHz to 81 GHz range. However, it is envisaged, that in other examples the circuits and concepts herein described may be equally applied to any mmW radar unit or system and any very-high operating frequency, for example where the testing system may require or benefit from continuous monitoring of the radar unit receiver performance.

Advantageously, the continuous monitoring of the radar unit receiver performance may be performed concurrently with the radar unit normal mode of operation, thereby not disturbing or interrupting the application. This approach addresses a recent functional safety need in automotive applications where 'in-the-field' testing is desirable or even required or mandatory. Furthermore, this approach addresses the problem with transient faults, which are becoming more prevalent.

Examples of the invention also benefit from removing a need to employ dedicated test signal generation circuitry used for (off-line) test signal, single receiver component measurements, or for plausibility checks. Examples of the invention also find particular applicability in the context of functional safety applications, for example in the sense of ISO 26262 for detecting either a permanent defect and/or a transient defect (e.g. (sudden event upsets) in the LO, the transmitter chain or receiver chain, in a real-time manner.

Examples of the invention also enable a continuous monitoring of the radar unit receiver performance over a long period of time, thereby providing a possibility to take into account slow ageing effects, such as Negative Bias Temperature Instability (NBTI) performance degradation in CMOS ICs due to the dielectric between gate and channels degrading or Hot Carrier Injection (HCI), which also exhibits performance degradation due to charged particles entering the dielectric and changing its properties. Furthermore, since the two signals (i.e. the transmit mmW signal and the received echo version of the transmit mmW signal) are substantially fully correlated based on monitoring successive chirps, any phase noise effect on the analysis of the received signal spectrum is minimal, which enhances the detectability of the signal peaks.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above. The connections as discussed herein may be any type of connection suitable to transfer RF, AC or DC signals from or to the respective nodes, units or devices or components. Accordingly, unless implied or stated otherwise, the connections may for example be direct connections or indirect connections. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Those skilled in the art will recognize that the architectures depicted herein are merely exemplary, and that in fact many other architectures can be implemented which achieve the same functionality. Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality.

Also for example, in one embodiment, the illustrated examples may be implemented as circuitry located on a single integrated circuit such as single IC 150 of FIG. 1 or IC 350 of FIG. 3 or within a same device. Examples of the invention find applicability in many applications, including packaged ICs, and wafer test systems where the IC is not yet packaged), and/or in systems where a bare, unpackaged die is mounted on a printed circuit board (PCB). In some examples, the circuit and/or component examples may be implemented as any number of separate integrated circuits or separate devices interconnected with each other in a suitable manner. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one, or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

What is claimed is:

1. A radar unit comprises:
a frequency generation circuit configured to generate a millimetre wave, mmW, frequency modulated continuous wave, FMCW, transmit signal comprising a plurality of chirps;
a transmitter circuit configured to transmit the generated mmW FMCW transmit signal:
a receiver circuit configured to receive an echo of the mmW FMCW transmit signal; and;
a processor coupled to the receiver circuit and configured to process the echo of the mmW FMCW transmit signal;
wherein:
the receiver circuit is configured to operate with at least two different paths for at least two successive chirps of the mmW FMCW transmit signal and create therefrom at least two respective received chirp signals by selectably introducing a filter into a receiver path carrying one of the at least two received successive chirps; and
the processor circuit is configured to process and compare the at least two respective received chirp signals and determine therefrom an operational state of at least one circuit or component within the receiver circuit.

2. The radar unit of claim 1 wherein the processor is configured to process and compare the at least two respective received chirp signals and determine therefrom an operational state of at least one of: an analog circuit, a mixed-signal circuit, within the receiver circuit.

3. The radar unit of claim 2 wherein the processor is configured to process and compare the at least two respective received chirp signals and determine therefrom a linearity performance of at least one of: a receiver amplifier, a local oscillator, LO, a receiver down-mixer, an analog-to-digital converter, ADC, a signal generator, within the receiver circuit.

4. The radar unit of claim 3 wherein the processor is configured to perform a real-time ADC parameter performance estimate and adjust a performance of the ADC in response thereto.

5. The radar unit of claim 1 wherein the at least two successive chirps of the mmW FMCW transmit signal comprise at least two immediately successive chirps, or two chirps that are separated in time such that coherency between the received chirps is maintained.

6. The radar unit of claim 1 wherein the receiver circuit is configured to operate with at least two different paths for at least two successive chirps of the mmW FMCW transmit signal and create therefrom at least two respective received chirp signals by injecting a DC offset into one of the at least two received successive chirps.

7. The radar unit of claim 6 wherein the injected DC offset is removed by a baseband processor comprising an application signal processing path configured to calculate a target map.

8. The radar unit of claim 1 wherein a filtering response of the selectable filter is removed by a baseband processor comprising an application signal processing path configured to calculate a target map.

9. An integrated circuit for a built-in self-test, BIST, radar unit, wherein the integrated circuit comprises:
a frequency generation circuit configured to generate a frequency modulated continuous wave, FMCW, transmit signal comprising a plurality of chirps;
a receiver circuit configured to receive an echo of the FMCW transmit signal; and;
a processor coupled to the receiver circuit and configured to process the received echo of the FMCW transmit signal;
wherein:
the receiver circuit is configured to operate with at least two different paths for at least two successive chirps of the FMCW transmit signal and create therefrom at least two respective received chirp signals by selectably introducing a filter into a receiver path carrying one of the at least two received successive chirps; and
the processor is configured to process and compare the at least two respective received chirp signals and determine therefrom an operational state of at least one circuit or component within the receiver circuit.

10. The integrated circuit of claim 9 wherein the processor is configured to process and compare the at least two respective received chirp signals and determine therefrom an operational state of at least one of: an analog circuit, a mixed-signal circuit, within the receiver circuit.

11. The integrated circuit of claim 9 wherein the at least two successive chirps of the FMCW transmit signal comprise at least two immediately successive chirps, or two chirps that are separated in time such that coherency between the received chirps is maintained.

12. The integrated circuit of claim 9 wherein the receiver circuit is configured to operate with at least two different paths for at least two successive chirps of the FMCW transmit signal and create therefrom at least two respective received chirp signals by injecting a DC offset into one of the at least two received successive chirps.

13. The integrated circuit of claim 9 wherein a filtering response of the selectable filter is removed by a baseband processor comprising an application signal processing path configured to calculate a target map.

14. A method for testing in a millimetre wave (mmW) built-in self-test, BIST, radar unit, the method comprising:
generating and transmitting a millimetre wave, mmW, frequency modulated continuous wave, FMCW, transmit signal comprising a plurality of chirps;

receiving and processing a received echo of the mmW FMCW transmit signal;

operating a receiver circuit with at least two different paths for at least two successive chirps of the mmW FMCW transmit signal;

creating at least two respective received chirp signals from the received echo of the mmW FMCW transmit signal routed via the at least two different paths comprises creating at least two respective received chirp signals by selectably introducing a filter into a receiver path carrying one of the at least two received successive chirps;

processing and comparing the at least two respective received chirp signals; and determining from the compared at least two respective received chirp signals an operational state of at least one circuit or component within the receiver circuit.

15. The method of claim 14 wherein determining comprises determining from the compared at least two respective received chirp signals a linearity performance of at least one of: a receiver amplifier, a local oscillator, LO, a receiver down-mixer, an analog-to-digital converter, ADC, a signal generator, within the receiver circuit.

16. The method of claim 14 wherein the at least two successive chirps of the mmW FMCW transmit signal comprise at least two immediately successive chirps, or two chirps that are separated in time such that coherency between the received chirps is maintained.

17. The method claim 14 wherein creating at least two respective received chirp signals from the received echo of the mmW FMCW transmit signal routed via the at least two different paths comprises creating at least two respective received chirp signals by injecting a DC offset into one of the at least two received successive chirps.

* * * * *